(12) United States Patent
Isberg

(10) Patent No.: US 6,483,335 B1
(45) Date of Patent: Nov. 19, 2002

(54) SIMPLE CHIP IDENTIFICATION

(75) Inventor: Martin Isberg, Lund (SE)

(73) Assignee: Telefonaktiebolaget LM Ericsson, Stockholm (SE)

(*) Notice: Subject to any disclaimer, the term of this patent is extended or adjusted under 35 U.S.C. 154(b) by 18 days.

(21) Appl. No.: 09/614,583

(22) Filed: Jul. 12, 2000

(51) Int. Cl.[7] .............................................. G01R 31/02
(52) U.S. Cl. ..................... 324/764; 324/158.1; 324/763
(58) Field of Search .......................... 324/67, 763, 764, 324/73 R, 158 R, 158 P, 158 T, 501, 537; 714/724; 371/15, 20, 25; 257/48, 532; 702/59; 361/42

(56) References Cited

U.S. PATENT DOCUMENTS

| 3,737,769 A |   | 6/1973 | Terase et al. |
| 4,801,867 A | * | 1/1989 | Suzuki ........................ 324/763 |
| 6,202,181 B1 | * | 3/2001 | Ferguson .................... 714/724 |
| 6,222,358 B1 | * | 4/2001 | Wotrich ....................... 324/67 |

FOREIGN PATENT DOCUMENTS

| EP | 1003234 A1 | 5/2000 |
| JP | 03082560 | 4/1991 |
| JP | 05055339 | 3/1993 |
| JP | 08136612 | 5/1996 |

* cited by examiner

Primary Examiner—Michael Sherry
Assistant Examiner—Trung Nguyen
(74) Attorney, Agent, or Firm—Burns Doane Swecker & Mathis LLP

(57) ABSTRACT

A technique for identifying circuits within an electrical device is disclosed. In one embodiment, additional current sink paths are associated with one or more circuits within the electrical device and measurements of additional current drawn by the current sink paths can be used to identify the associated circuit. In an additional embodiment, a special mode of operation is implemented in the electrical device where the circuit to be identified outputs identity signals in response to control signals from a controller. In a further embodiment, a shift register is activated in the special mode of operation to serially output an identity word in response to the control signals from the controller.

14 Claims, 5 Drawing Sheets

SIMPLE CHIP IDENTIFICATION

BACKGROUND

The present invention relates generally to techniques for identifying circuits within electrical devices.

Electrical devices commonly consist of one or more circuit boards mounted inside some manner of mechanical case. These circuit boards further commonly have a number of circuits mounted on each board. Often there is a need to identify one or more of the circuits mounted on each board within the electrical device. For example, in the instance where the device is to be loaded with new software and the proper version of software is dependent on the identities of the circuits within the electrical device, it would be necessary to determine the identities of the circuits within the electrical device. A manual inspection of the electrical device may, of course, be conducted. Such a manual inspection, however, will likely require some lengthy disassembly. Furthermore, even after disassembly, the identity of the individual circuits on the circuit boards may not be so readily apparent as to make them easily identifiable by visual inspection. Thus, it would be advantageous to have the capability to electrically communicate the identity of one or more circuits located within an electrical device to an external entity.

Electrical communication of the identity of circuits within an electrical device has conventionally been performed using two-way communication buses. With this conventional technique, a device outputs, on the two-way bus, the identity of a circuit within the device in response to requests received over the two-way bus. Conventionally, two-way communication buses are implemented in CMOS circuitry using standardized cells that consume small quantities of energy. When the electrical device uses analog bipolar circuitry, however, use of a two-way bus is impractical because of its complexity and high power consumption. Therefore, electrical devices with analog bipolar circuitry usually only have the capability for one-way communication and thus can only receive data without having the capability of transmitting data. Communicating the identity or identities of circuits within an electrical device therefore is problematic when the electrical device uses primarily analog bipolar circuits.

SUMMARY

Thus, it is an object of the exemplary embodiments of the present invention to provide a technique for identifying a circuit within an electrical device.

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

According to one exemplary embodiment of the invention a circuit within an electrical device is identified. In some embodiments, this is accomplished by: measuring a first current drawn by the circuit; and, for a number of times, n, successively controlling at least a portion of the circuit so as to affect the current drawn by the circuit, and for each of the n times, measuring the affected current drawn by the circuit, wherein n is a number greater than or equal to 1. The identity of the circuit is then determined using n values corresponding to the difference between each of the n affected currents and the first current.

In some embodiments, it may be sufficient to let n be equal to 1, and still be able to identify which of a number of possible circuits the particular circuit of interest is.

According to a further exemplary embodiment of the invention a system for identifying a circuit within an electrical device is provided. This exemplary embodiment comprises: logic that sends a control signal to the circuit over a first circuit path; logic that outputs from said circuit over a second circuit path one or more signals in response to said control signal; and logic that identifies said circuit based on said one or more signals.

According to an additional exemplary embodiment of the invention a method for identifying a circuit within an electrical device is provided. This exemplary embodiment comprises: sending a control signal to the circuit over a first circuit path; outputting from the circuit one or more signals over a second circuit path in response to said control signal; and identifying the circuit based on the one or more signals.

BRIEF DESCRIPTION OF THE DRAWINGS

The objects and advantages of the invention will be understood by reading the following detailed description in conjunction with the drawings in which.

DETAILED DESCRIPTION

Figure 1A:
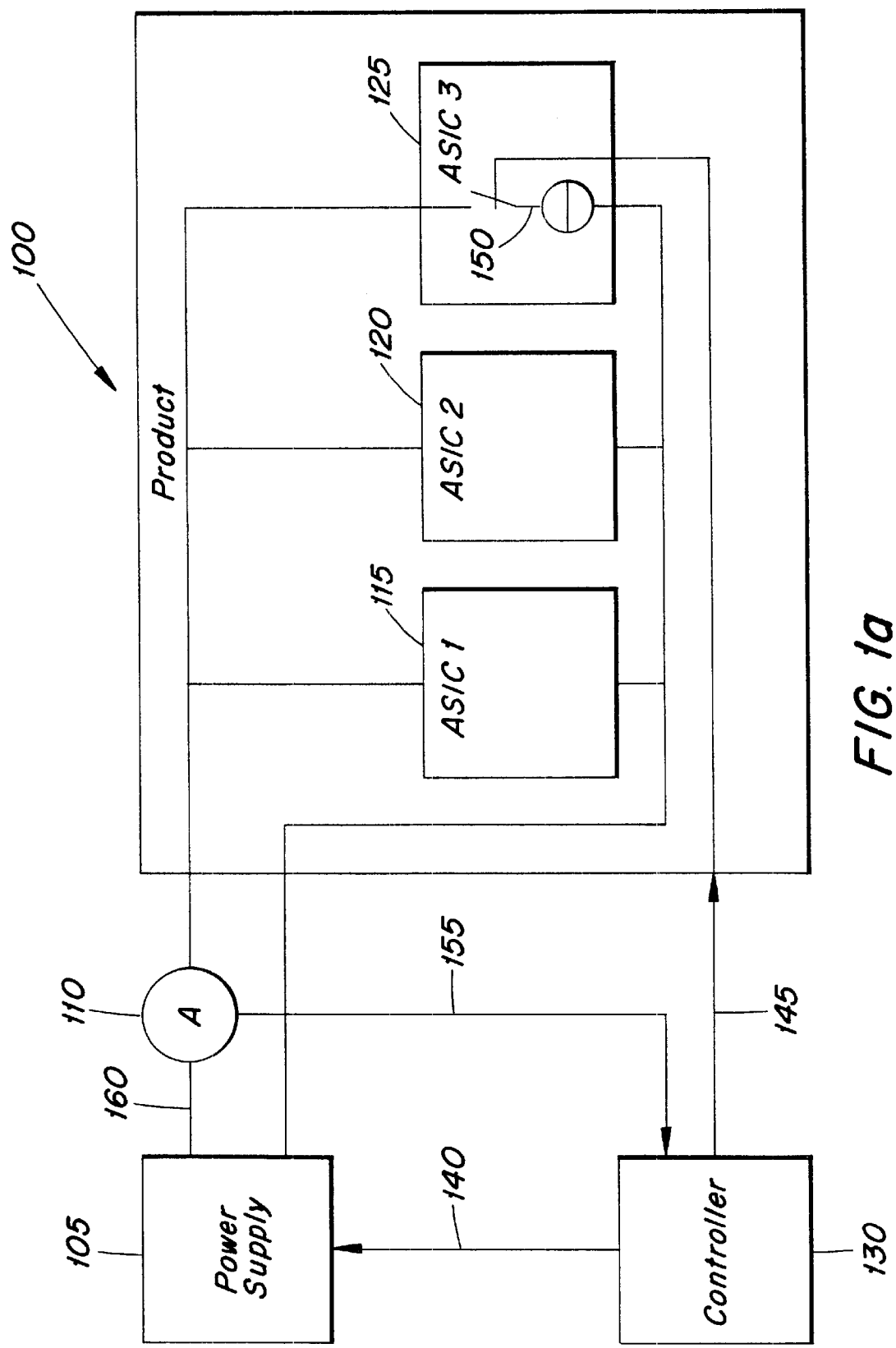
FIGS. 1a and 1b are block diagrams of circuit identification circuitry in accordance with exemplary embodiments of the invention.

The various features of the invention will now be described with respect to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

Figure 1B:
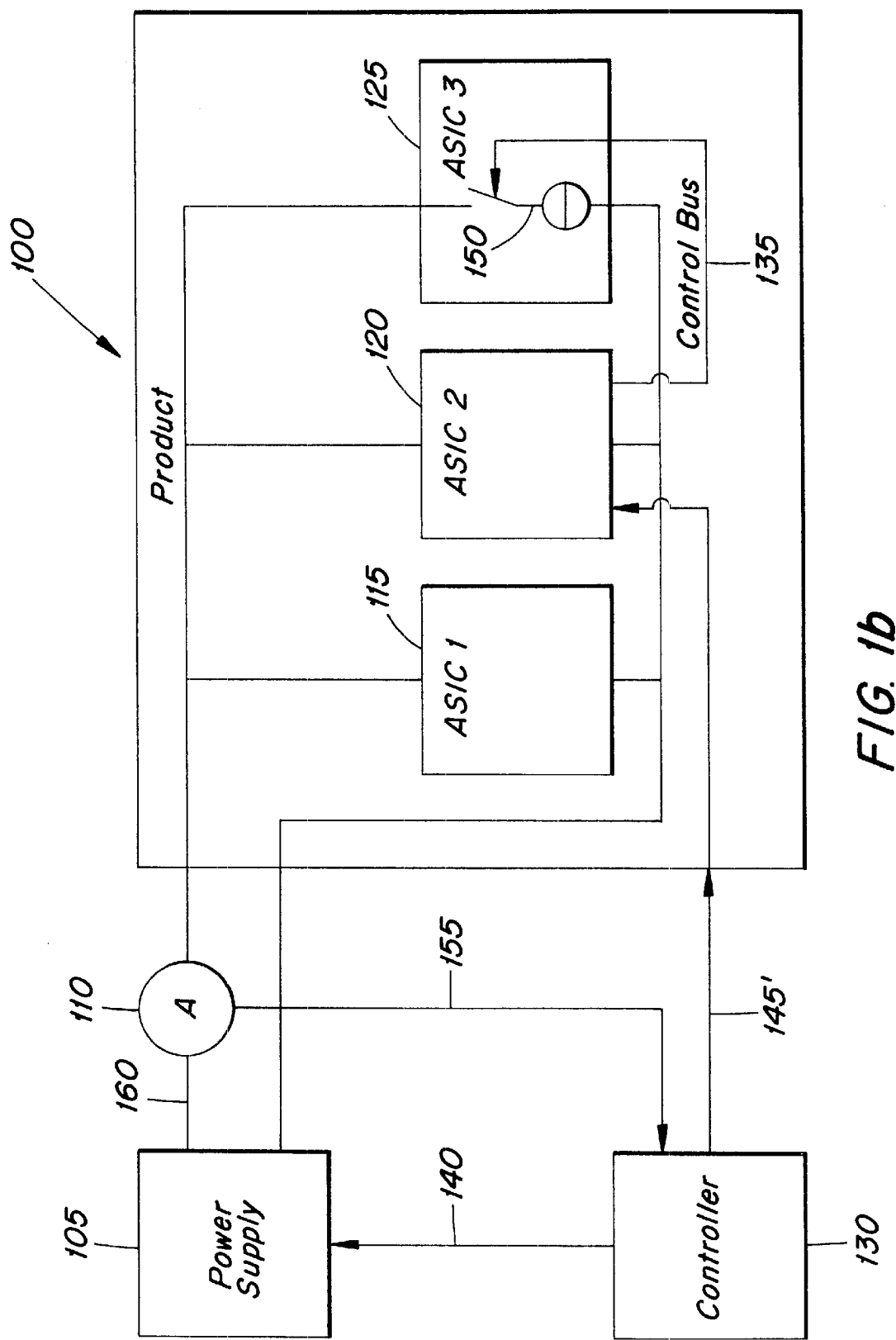

FIGS. 1a and 1b illustrate exemplary embodiments of the invention that can be used where the circuits that are to be identified within an electrical device are capable of receiving one-way communication. As shown in FIG. 1a, an electrical device 100 may contain a number of circuits, such as for example, a number of Application Specific Integrated Circuits (ASIC's). For purposes of illustration, however, only three ASIC's 115, 120, and 125 are shown in FIG. 1a. To identify an ASIC, such as ASIC3 125, additional monitoring and control devices are connected to the electrical device 100. A power supply 105 is connected, through an ammeter 110, to each ASIC (115, 120, and 125) to provide a supply of current to each. A controller 130 is additionally connected to the power supply 105, via control line 140, and to the ASIC3 125 that is to be identified, via one-way bus 145.

In one embodiment, identification of ASIC3 125 is initiated by the controller 130 sending a command, via line 140, to the power supply 105. This command sets a specified voltage level that is to be supplied via the power supply line 160 to the ASIC's. In an alternative embodiment, the power supply voltage may be fixed and, thus, the controller will not be required to send a voltage level setting command to the power supply 105. In either embodiment, however, an ammeter 110 is placed in series with power supply line 160 to monitor the sum of the currents drawn by the ASIC's at an initial time $t_1$. The monitored current level at time $t_1$ is then reported to the controller 130 via communication line 155. The controller 130 stores in memory the sum of currents drawn by the ASIC's, denoted herein as the reference current $i_{ref}$.

The controller 130 then initiates a command over the one-way bus 145 to "switch in" a current path 150 that is associated with, or located within, the ASIC that is to be identified (identification of ASIC3 is shown in FIG. 1). "Switching in" current path 150 causes a different amount of current $i_{ref}+\Delta i$ to flow from the power supply 105. After "switching in" current path 150, the sum of the currents drawn by the ASICs at a second time $t_2$ is measured by the ammeter 110 and the measurement is reported to the controller 130.

The controller 130 then subtracts the sum of the drawn current measured at $t_2$ from the sum of the drawn current $i_{ref}$ measured at time $t_1$. The subtracted result is equal to the change in current $\Delta i$ attributable to current path 150. Current path 150 can be designed such that the different current drawn by the path 150 corresponds to identities of ASIC3 125. The current drawn by the path can be associated with different types of ASIC's, with the same type of ASIC but manufactured by different vendors, or with different versions of the same type of ASIC manufactured by the same vendor. Thus, each version of ASIC will draw a different $\Delta i$ and the $\Delta i$ determined by the controller as described above can be used to identify the ASIC.

FIG. 1b illustrates an alternative embodiment of the invention. The arrangement of FIG. 1b is similar to that of FIG. 1a, except that here, the one-way bus 145' does not go to the ASIC to be measured (ASIC3 125), but instead connects the controller 130 to the second ASIC, ASIC2 120. In addition, ASIC2 120 has a control bus 135 that supplies a control signal for "switching in/out" the current path 150. This is done in response to a command received by ASIC2 120 via the one-way bus 145'. The operation of this arrangement is otherwise the same as that described above with respect to FIG. 1a, and will therefore not be repeated.

Figure 2:
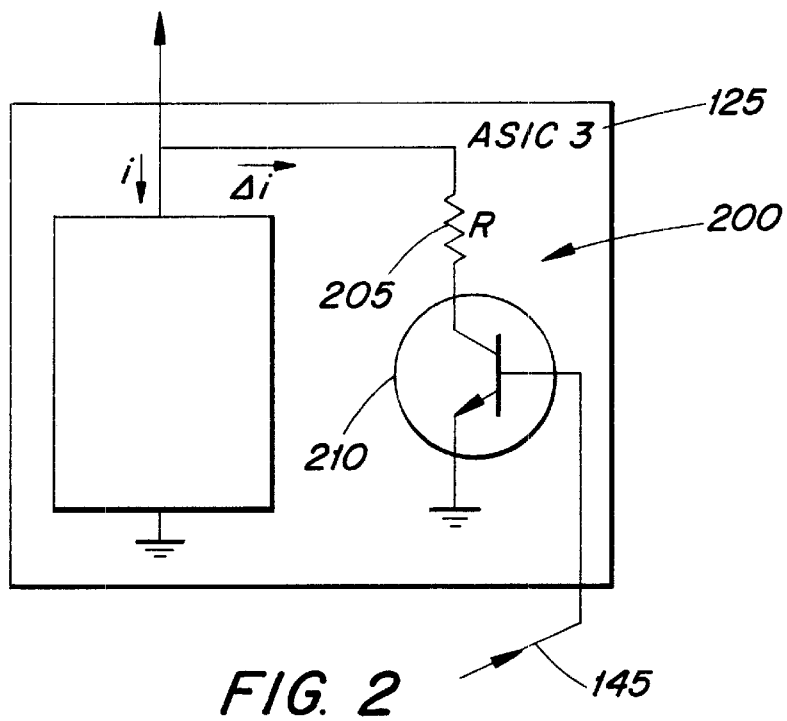
FIG. 2 is a schematic diagram of current sinking circuitry in accordance with the invention.

For the purposes of identifying a circuit in an electrical device (such as ASIC3 125 shown in FIGS. 1a and 1b), one or more current sinking paths can be incorporated into, or associated with the circuit. One example of such current sinking circuitry is shown in FIG. 2. This current sinking path 200 comprises a resistor 205 in series with a switch transistor 210. When an "activation" command is received from controller 130 over the one-way bus 145, transistor switch 210 is "turned on." An additional current, above and beyond the current nominally drawn by ASIC3 125, is then drawn through the resistor 205. The additional current $\Delta i$ is thus set by the value of the resistance of the resistor 205.

In this exemplary embodiment, a limit on the number of different versions or revisions of circuit ASIC3 125 that can be identified is set by the accuracy of the resistor 205. As is known in the art, resistor accuracies (i.e., deviations from nominal values) vary depending on the type and quality of the individual resistor.

Figure 3:
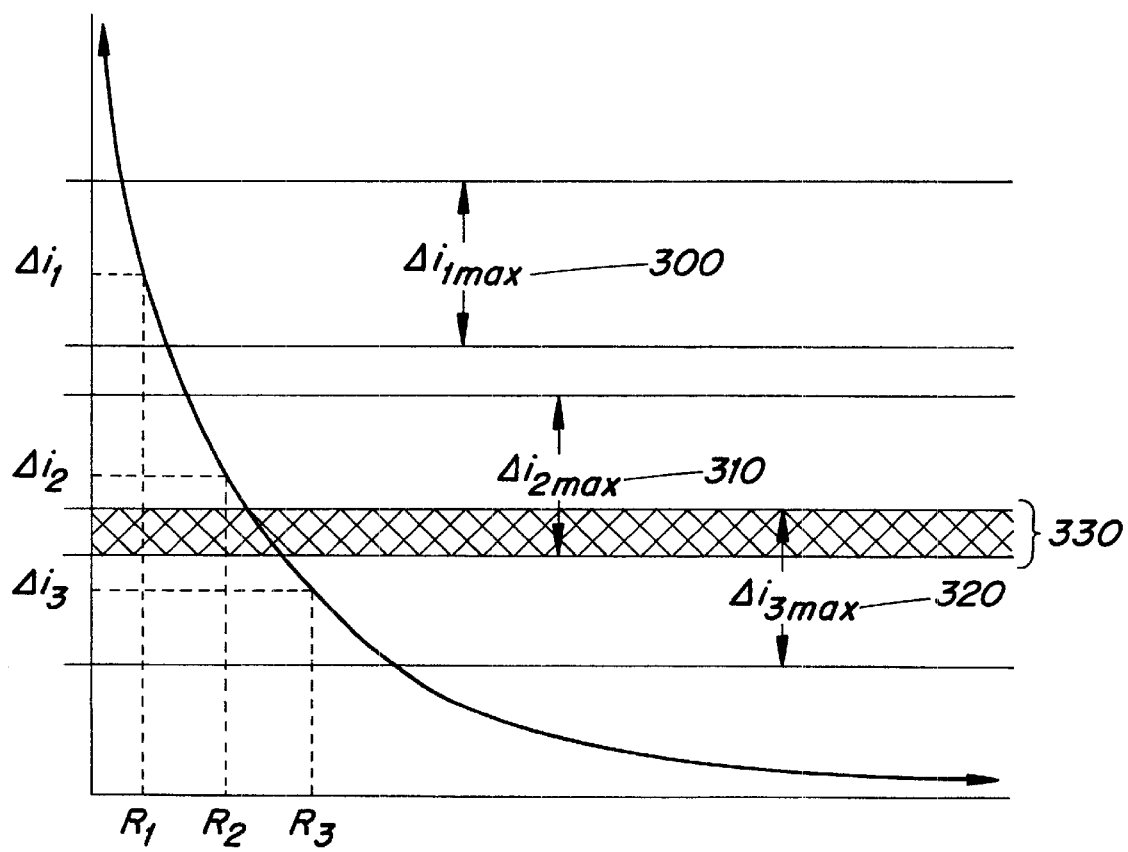
FIG. 3 is a graph of the currents and resistances associated with current sinking circuitry of the invention.

For example, the accuracy of an integrated resistor can be as poor as 20%. The accuracy of the resistor 205 (FIG. 2), selected for use in sink path 200 (FIG. 2), will determine the range of different currents $\Delta i$ over which a circuit's identification can be made. Different resistance values for resistor 205 (e.g., $R_1, R_2, R_3 \ldots, R_n$) can only be used where their deviations from nominal values will not produce ranges of difference currents ($\Delta i$) that "overlap." As shown in FIG. 3, the maximum tolerances of $R_1$ and $R_2$ produce ranges of difference currents corresponding to $\Delta i_{1max}$ 300 and $\Delta i_{2max}$ 310, respectively. Since, as shown in the figure, there is no "overlap" of these two ranges of difference currents, the circuit revisions/versions that correspond to $R_1$ and $R_2$ can be easily distinguished. However, as shown at 330 in FIG. 3, if the value of $R_3$ is selected such that it's inaccuracies produces a range of difference currents that may "overlap" the difference currents of $R_2$, then an inaccurate identification of the ASIC associated with $R_2$ or $R_3$ may be made.

Figure 4:
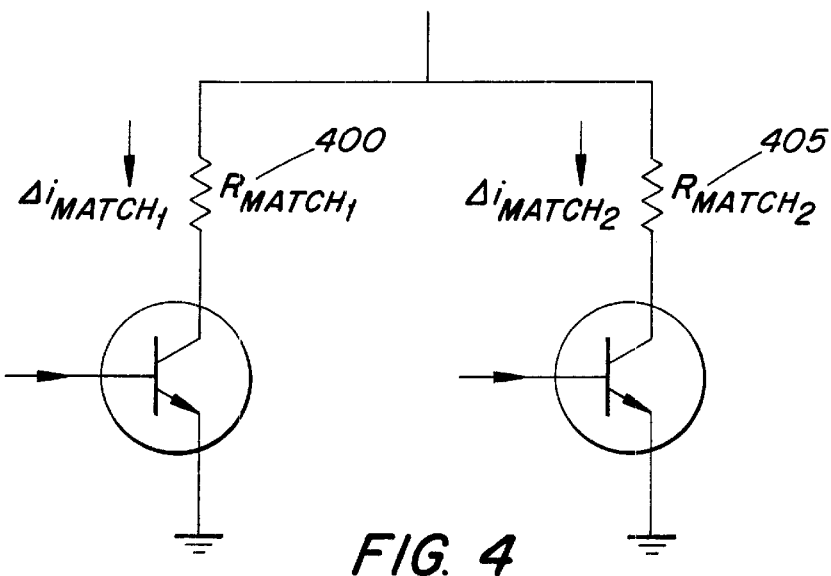
FIG. 4 is a schematic diagram of current sinking circuitry using matched resistances in accordance with the invention.

One exemplary solution to the limitation on the number of circuit versions that can be identified, as noted above, uses two current sinking paths that contain resistors with matched resistance values. One example of such a solution is illustrated in FIG. 4, where matched resistors $R_{Match1}$ 400 and $R_{Match2}$ 405 are used for identifying the associated circuit version. Even though each of the resistors $R_{Match1}$ 400 and $R_{Match2}$ 405 may have resistance values that deviate as much as 20% or more from nominal values, these resistors are matched together such that their actual resistance values are within a very low tolerance value of one another (approximately 1%). In operation, the two current paths are "activated" successively or simultaneously and the ratios of the measured difference currents $\Delta i_{Match1}$ and $\Delta i_{Match2}$ can be determined to identify the circuit.

In this exemplary embodiment, the version of the ASIC circuitry would be set by the multiple of $R_{Match1}$ chosen for $R_{Match2}$. Thus, $R_{Match2}$ is selected such that its actual resistance value is a fraction (1/n) of the resistance value of $R_{Match1}$:

$$R_{match2} = R_{Match1} * (1 \pm \epsilon)/n$$

where n = a number assigned to each of the different circuit revisions $\{1, 2, 3, \ldots \}$; and $\epsilon$ = tolerance that $R_{Match2}$ is within 1/n of $R_{Match1}$ The measured current ratio used to identify the circuit associated with $R_{Match2}$ is therefore the following:

$$\frac{\Delta i_{Match1}}{\Delta i_{Match2}} = \frac{R_{Match2}}{R_{Match1}} = \frac{(1 \pm \varepsilon)}{n}$$

The error in circuit identification is thus determined by the matching tolerance between $R_{Match1}$ and $R_{Match2}$.

The circuit identification circuitry shown in FIGS. 2 and 4, and described above, is for illustrative purposes only. One skilled in the art will recognize that a number of different current path circuit configurations could be used in accordance with the general principles of the present invention. For example, in some embodiments ASIC3 can be configured such that less current is drawn from the power supply 105 in response to an instruction from controller 130. In such a configuration, the control signal over one-way 145 may "switch in" additional resistance in ASIC3 so as to limit the current drawn from power supply 105.

Figure 5:
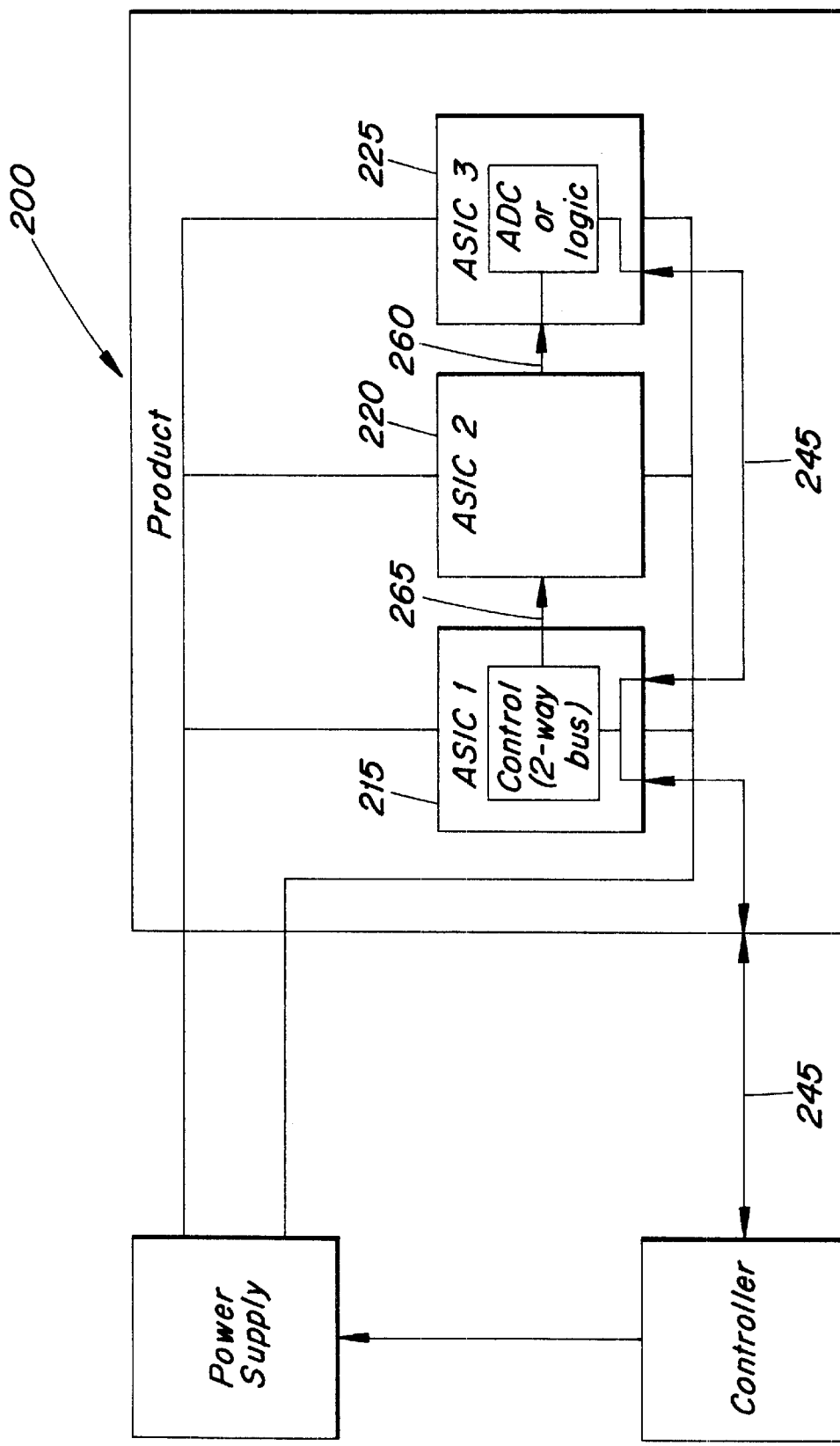
FIG. 5 is a block diagram of circuit identification circuitry in accordance with an exemplary embodiment of the invention.

An additional exemplary embodiment of the invention is illustrated in FIG. 5. This embodiment provides circuit identification in the device configuration where the circuit to be identified (ASIC2 in the figure) does not have the capability of communicating by either a one-way or a two-way bus, but does have an output 260 that can be monitored by at least one other circuit 225 within the electrical device 200. Additionally, the circuit to be identified must be controllable by a control signal 265 such as, for example, a one-way bus or a single control signal (e.g., one logic pin) within the electrical device 200. In one exemplary embodiment in which ASIC2 200 generates analog signals rather than digital logic signals, the monitoring circuit ASIC3 225 may contain an analog-to-digital (A/D) converter for converting the analog output voltage or current signal from ASIC2 220 into a digital signal. In another exemplary embodiment, the monitoring circuit 225 may alternatively contain a logic interface for receiving one or more logic signals from ASIC2 220. In the circuit configuration shown, ASIC2 220 and the A/D converter of ASIC3 225 are used for purposes other then circuit identification when the electrical device 200 is operating normally. The circuit identification function of the following exemplary embodiments is a special mode of operation that can be initiated by the controller 230.

In the exemplary embodiment where ASIC2 220 produces an analog voltage or current signal in response to a control signal 265 from ASICL 215, an A/D converter in ASIC3 225 converts the analog signal to a digital representation that can be used for identifying ASIC2 220. In such an arrangement, controller 230 instructs ASICL 215 to initiate a command over the one-way bus/logic pin 265 to cause ASIC2 220 to output an analog voltage or current signal. The A/D converted analog voltage or current signal is then communicated over the two-way bus 245 to the controller 230. The controller 230 then identifies ASIC2 220 based on the digital representation received from ASIC3 225.

One skilled in the art will recognize that the ASIC's (ASIC1 215, ASIC2 220, ASIC3 225) shown in FIG. 5 can be different portions of the same circuit. For example, ASICL 215 could be a controller in the digital baseband circuitry of a transceiver of a radio communication device and ASIC3 225 could be the mixed-signal baseband circuit, containing an A/D converter, in the transceiver of the radiocommunication device. The circuitry represented by ASIC2 220 could be the intervening circuitry between the controller and the mixed-signal baseband circuit, or alternatively could be any circuit in the product.

Figure 6:
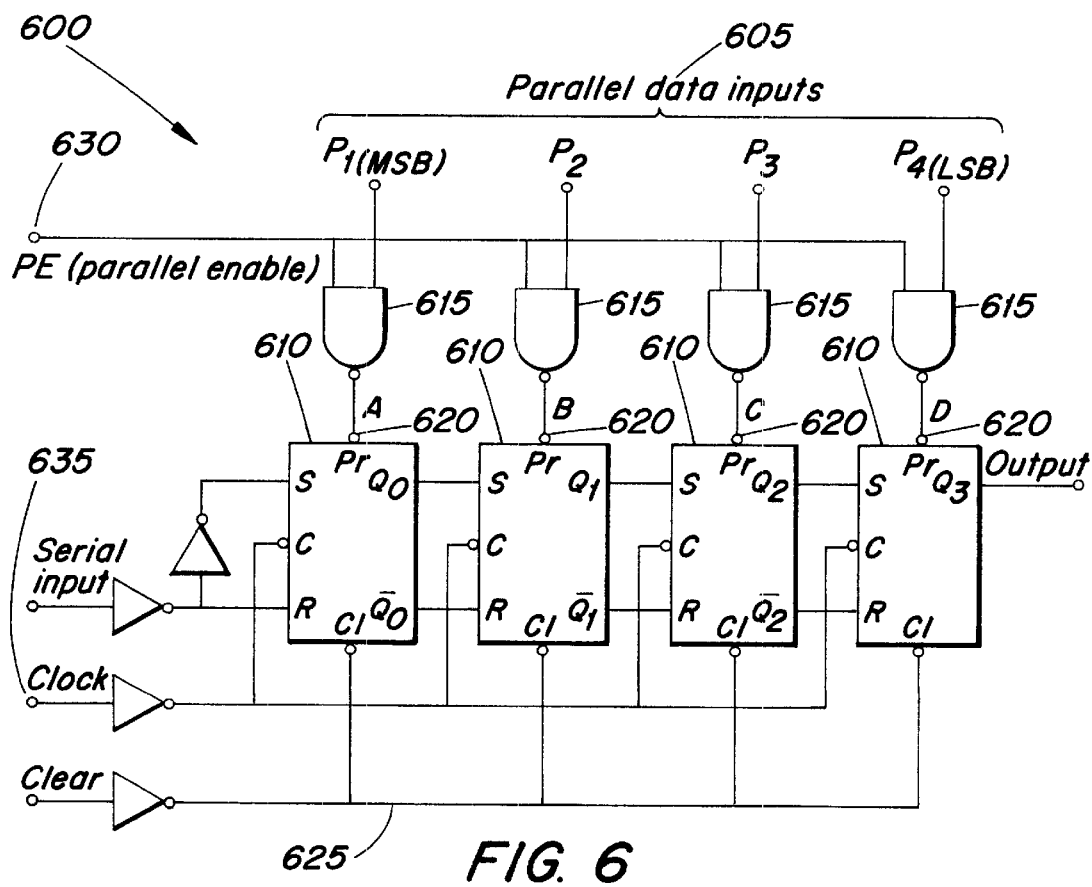
FIG. 6 is schematic diagram of an exemplary shift register in accordance with an embodiment of the invention.

In the exemplary embodiment where the monitoring circuit ASIC3 225 contains a logic interface, the output from ASIC2 220 would be one or more logic signals. The one or more logic signals received by ASIC3 225 would then be communicated over two-way bus 245 to controller 230 for identification of ASIC2 220. ASIC1 215 first initiates a logic command in response to an instruction from controller 230 which requests ASIC2 220 to identify itself. To perform this function, ASIC2 220 could use a parallel input shift register such as the exemplary 4 bit register 600 shown in FIG. 6. The parallel inputs (P1, P2, P3, P4) 605 to the shift register in this case are selected so as to uniquely specify the identity of ASIC2 220 and could be, for example, hard wired through the direct connection of the parallel inputs either to a ground connection (for a logic low) or to the power supply voltage (for a logic high).

The logic control signal from ASIC1 215 would initiate the loading of the hard coded identity inputs to the shift register in the following fashion. In the shift register of FIG. 6, all RS flip-flops 610 would first be cleared (clear input is high) and the NAND gates 615 with output A, B, C and D 620 feeding the preset terminals (Pr) 620 would initially be disabled by applying a low parallel-enable (PE) voltage. Next, the clear input 625 would be set to low and the PE terminal 630 would be set to high so as to apply the hard coded identity word to the respective Pr inputs 620 of the RS flip-flops 610. The hard wired data word would thus be transferred to the internal preset terminals A, B, C, and D 620, and to the flip-flop outputs, independent of the clock. The PE level 630 is then set low to disable the NAND gates 615, and application of three clock pulses at the Clock input 635 would cause the hard coded identity word to appear serially at the output terminal Q3 640. Changes in circuit identity can be made by changing the hard coded inputs to the shift register. One skilled in the art will recognize that the exemplary shift register illustrated in FIG. 6 could be modified to include more flip-flops, thus increasing the resolution of the ASIC identity word.

The invention has been described with reference to particular embodiments. However, it will be readily apparent to those skilled in the art that it is possible to embody the invention in specific forms other than those of the preferred embodiments described above. This may be done without departing from the spirit of the invention.

For example, the number of possible circuits that can be identified by means of the above-described techniques can be extended by performing additional measurements (either in parallel or in series) to generate a plurality of current measurements. That is, for a number of times, n, at least a portion of the circuit is successively controlled so as to affect the current drawn by the circuit, and for each of the n times, the affected current drawn by the circuit is measured. In these embodiments, n is a number greater than 1. (It will be recognized that the earlier described embodiments can be derived by setting n equal to 1.) Then, the identity of the circuit is determined using n values corresponding to the difference between each of the n affected currents and the first current. These n measurement values, when considered together, form a "word" that can identify the circuit in question.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method of identifying a circuit within an electrical device, comprising:

measuring a first current drawn by the circuit;

for a number of times, n, successively controlling at least a portion of the circuit so as to affect the current drawn by the circuit, and for each of the n times, measuring the affected current drawn by the circuit, wherein n is a number greater than or equal to 1; and determining the identity of the circuit using n values corresponding to the difference between each of the n affected currents and the first current.

2. The method of claim 1, wherein n equals 1.

3. The method of claim 1, further comprising:

first controlling a supply voltage level of the electrical device.

4. The method of claim 1, wherein successively controlling at least a portion of the circuit so as to affect the current drawn by the circuit comprises:

successively supplying a control signal to the electrical device, which control signal is supplied directly to the portion of the circuit so as to affect the current drawn by the circuit.

5. The method of claim 4, further comprising:

first controlling a supply voltage level of the electrical device.

6. The method of claim 1, wherein successively controlling at least a portion of the circuit so as to affect the current drawn by the circuit comprises:

successively supplying a first control signal to the electrical device, which first control signal is supplied to a different circuit within the electrical device; and for each of the first control signals supplied to the different circuit, generating a second control signal in the different circuit and supplying the second control signal to the portion of the circuit so as to affect the current drawn by the circuit.

7. The method of claim 6, further comprising:

first controlling a supply voltage level of the electrical device.

8. A system for identifying a circuit within an electrical device, comprising:

logic that measures a first current drawn by the circuit;

logic that, for a number of times, n, successively controls at least a portion of the circuit so as to affect the current drawn by the circuit, and for each of the n times, measures the affected current drawn by the circuit, wherein n is a number greater than or equal to 1; and logic that determines the identity of the circuit using n values corresponding to the difference between each of the n affected currents and the first current.

9. The system of claim 8, wherein n equals 1.

10. The system of claim 8, further comprising:

logic that first controls a supply voltage level of the electrical device.

11. The system of claim 8, wherein the logic that successively controls at least a portion of the circuit so as to affect the current drawn by the circuit comprises:

logic that successively supplies a control signal to the electrical device, which control signal is supplied directly to the portion of the circuit so as to affect the current drawn by the circuit.

12. The system of claim 11, further comprising:

logic that first controls a supply voltage level of the electrical device.

13. The system of claim 8, wherein the logic that successively controls at least a portion of the circuit so as to affect the current drawn by the circuit comprises:

logic that successively supplies a first control signal to the electrical device, which first control signal is supplied to a different circuit within the electrical device; and logic that, for each of the first control signals supplied to the different circuit, generates a second control signal in the different circuit and supplies the second control signal to the portion of the circuit so as to affect the current drawn by the circuit.

14. The system of claim 13, further comprising:

logic that first controls a supply voltage level of the electrical device.

* * * * *